United States Patent [19]

Kikkawa et al.

[11] 4,087,034
[45] May 2, 1978

[54] AUTOMATIC COMPONENT MOUNTING APPARATUS

[75] Inventors: Yoshio Kikkawa, Kyoto; Shigeru Namiki, Kadoma, both of Japan

[73] Assignee: Matsushita Electric Industrial Co., Ltd., Kadoma, Japan

[21] Appl. No.: 750,417

[22] Filed: Dec. 14, 1976

[30] Foreign Application Priority Data

Dec. 17, 1975 Japan .................. 50-151418
Dec. 17, 1975 Japan .................. 50-151419

[51] Int. Cl.² ........................................... B23Q 41/00
[52] U.S. Cl. ..................................... 227/90; 227/155; 29/564.1; 29/566.1
[58] Field of Search ................ 227/85, 90, 117, 118, 227/155; 29/564.1, 564.8, 566.1

[56] References Cited

U.S. PATENT DOCUMENTS

| | | | |
|---|---|---|---|
| 3,190,523 | 6/1965 | Van Rijsewijk | 227/117 X |
| 3,193,166 | 7/1965 | Bickel et al. | 227/85 |
| 3,796,363 | 3/1974 | Ragard | 227/90 X |

*Primary Examiner*—Gil Weidenfeld

[57] ABSTRACT

An automatic component mounting apparatus for automatically inserting and clinching terminal wires extending from each body of electric and/or electronic components to be mounted on a printed circuit board, which has a supply unit from which the components are successively delivered one at a time, an inserting head assembly for mounting each component on the printed circuit board with the terminal wires inserted through holes of one pair of holes in the circuit board, a pair of opposed transfer units positioned on respective sides of the inserting head assembly, a shaper assembly operatively carried by the inserting head for selectively receiving the component from either one of the transfer units and also for bending the terminal wires to give the component a substantially square-cornered U-shape in readiness for mounting thereof on the circuit board. A clinching unit for cutting off excessive portions of the component terminal wires and also for bending them is also included.

10 Claims, 19 Drawing Figures

AUTOMATIC COMPONENT MOUNTING APPARATUS

The present invention generally relates to a component mounting apparatus for automatically mounting electric and/or electronic components, hereinafter referred to generically as electrical components, on a printed circuit board and, more particularly, an automatic component mounting apparatus particularly utilizable with electrical components, such as resistors, capacitors and diodes, each being of a type having a pair of terminal wires extending in the opposite directions from each other from the body of the component.

With reference to FIGS. 1 and 2 of the accompanying drawings, mounting of a component on a printed circuit board 9 with the terminal wires inserted through holes in the printed circuit board has heretofore been carried out by first pushing a component 1, which has been fed to an appropriate position and which has a pair of opposed terminal wires 1a of equal length extending outwardly from respective ends of the component body, towards a pivotally supported shaper block 3 by means of a transfer slide 2 to bend the terminal wires 1a to give the component 1 a substantially square-cornered U-shape. The shaper block 3 is pivotally supported by a mounting pin 4 and is normally so biased by a spring 5 that a pair of opposed grooves 6 in the shaper block 3 are aligned with the transfer slide 2 as shown in FIG. 1. After the component 1 has been transferred onto the shaper block 3 with the bent terminal wires received in the grooves 6 and immediately after the slide 2 has departed from the shaper block 3, an inserter 7, which has been positioned above the shaper block 3, is moved downwardly and its lower end is engaged with and consequently pivots the shaper block 3 towards a downwardly oriented position as shown in FIG. 2. When the shaper block 3 assumes the downwardly oriented position, a cylindrical body 8 for the guide of the inserter 7 starts descending together with the inserter 7. The descending motion of the cylindrical body 8 is interrupted when the lower end 3a of the shaper block 3 approaches the upper surface of the printed circuit board 9, while the inserter 7 is allowed to continue its descending motion to push the component 1 so that the bent terminal wires thereof are inserted into the holes in the printed circuit board 9 as shown by the broken line in FIG. 2.

In this conventional method of component mounting, the shaping of the component 1 is performed by the grooves 6 in the shaper block 3 in cooperation with the transfer slide 2. This arrangement cannot accommodate components having different dimensions and, therefore, provides an undesirable variation in length of the bent terminal wires after the shaping of the individual components, which results in failure to mount the component properly on the printed circuit board. Moreover, since one or both of the terminal wires tend to be pulled outwardly from the body of the component during the shaping process, the component is susceptible to damage. Furthermore, since the arrangement is so designed that the component can be transferred onto the shaper block with the terminal wires pushed into the grooves in the shaper block by the transfer slide moving between the grooves in the shaper block, it often happens that the terminal wires of the component cannot substantially completely be received by the associated grooves and, therefore, one or both of the terminal wires tend to be broken.

The present invention has been developed with a view to substantially eliminating the above described disadvantages and inconveniences and is intended to provide an improved automatic component mounting apparatus wherein the shaping of the components one at a time to give the component a substantially square-cornered U-shape is performed while the terminal wires are retained in position, which apparatus can accommodate the components of different dimensions.

Another important object of the present invention is to provide an improved automatic component mounting apparatus of the above described type which is so designed that two kinds of components, the components of one kind having a smaller span between the bent terminal wires than that of the other kind, can be mounted on one and the same printed circuit board.

A further object of the present invention is to provide an improved automatic component mounting apparatus of the above described type capable of mounting the components one at a time on the printed circuit board without an excessive portion of each of the terminal wires being cut off prior to such mounting, cutting off of the excessive portions of the terminal wires of the individual components being performed after the bent terminal wires have been inserted through the printed circuit board and simultaneously with wire end clinching which is performed for securing the mounted component to the printed circuit board.

A still further object of the present invention is to provide an improved automatic component mounting apparatus of the above described type capable of mounting the components one at a time on the printed circuit board with the longitudinal axis of the body of the component oriented in either one of the two perpendicular directions parallel to the plane of the printed circuit board; capable of disposing of cut off portions of the terminal wires of the components; capable of detecting the presence or absence of the components mounted on the printed circuit board; and capable of confirming the accurate mounting of the component, if the latter is a diode which requires care in positioning relative to the polarity thereof.

These and other objects and features of the present invention will become apparent from the following description taken in conjunction with a preferred embodiment thereof with reference to the accompanying drawings, in which.

Figure 12A:
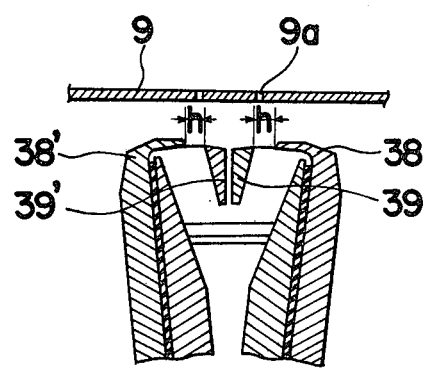
Figure 12B:
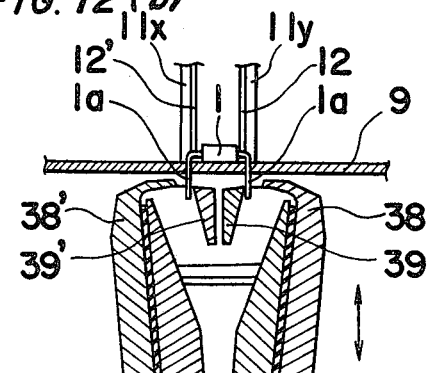
Figure 12C:
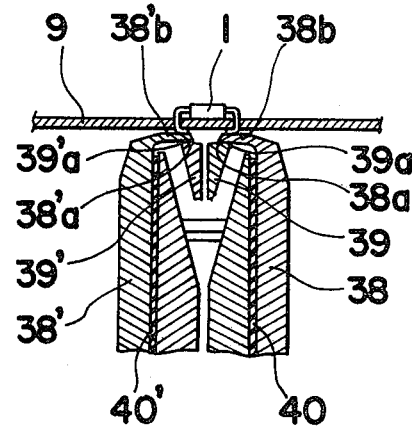
Figure 13:
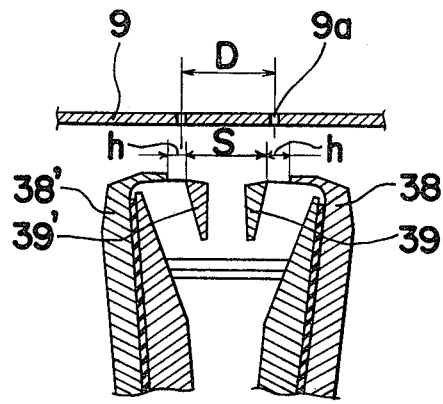
Figure 14:
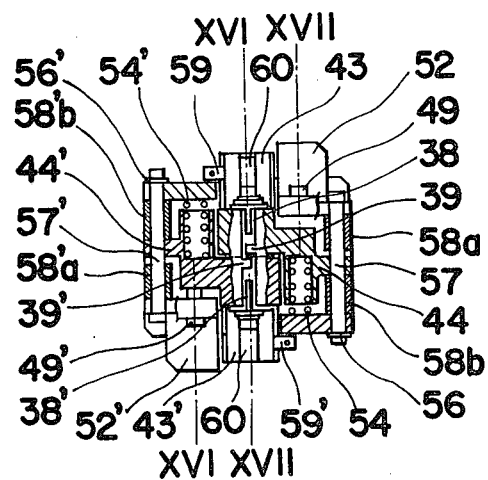
Figure 15:
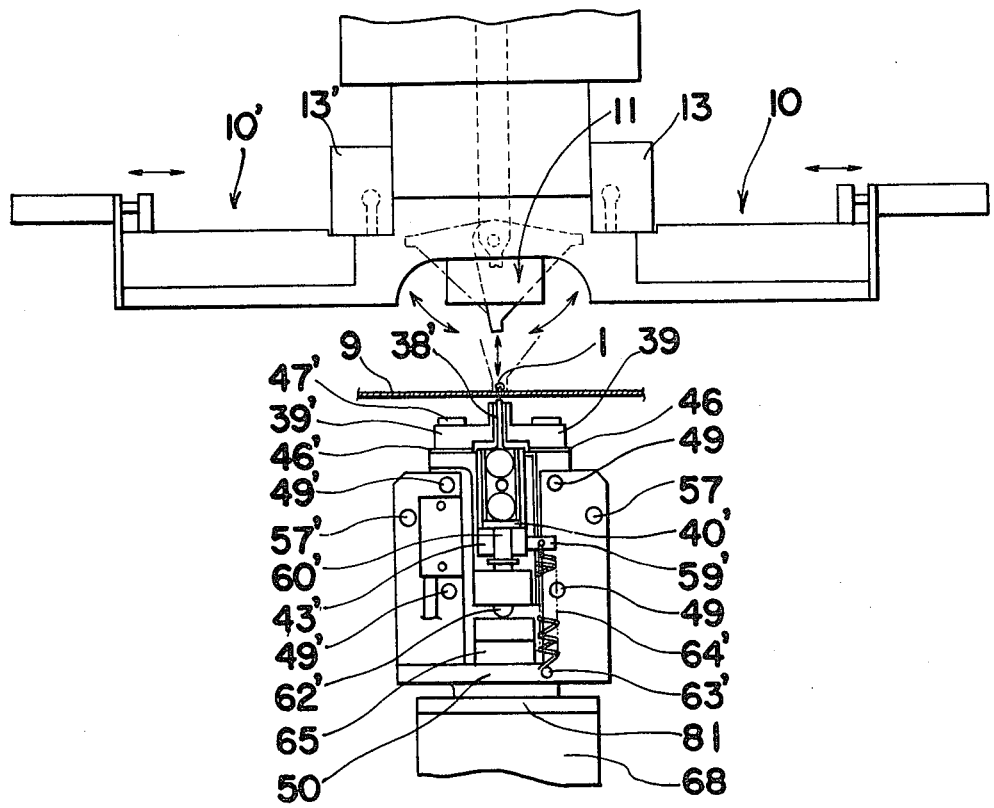
Figure 16:
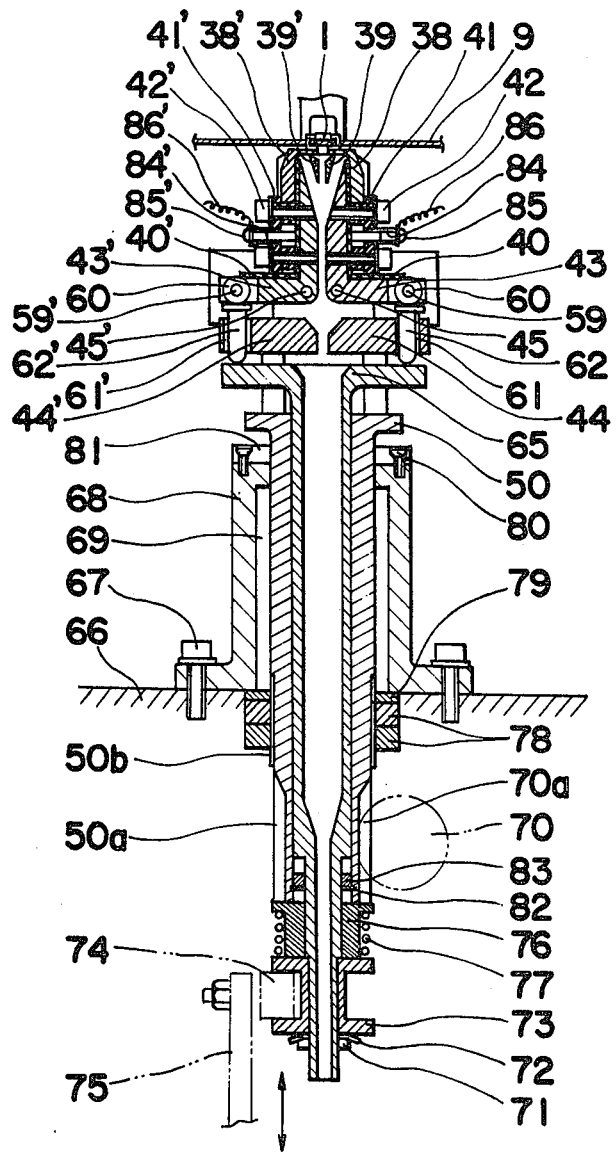

FIGS. 12(a) to 12(c) are schematic side sectional views of a portion of a clinching unit, showing the sequential operation of a clinching head;

FIG. 13 is a view similar to FIG. 12, showing the adjustment of the spacing between a pair of anvils employed in the clinching head;

FIG. 14 is a top plan view, with a portion broken away, of an upper portion of the clinching head;

FIG. 15 is a side elevational view of the clinching head;

FIG. 16 is a cross sectional view taken along the line XVI—XVI in FIG. 14; and

Figure 17:
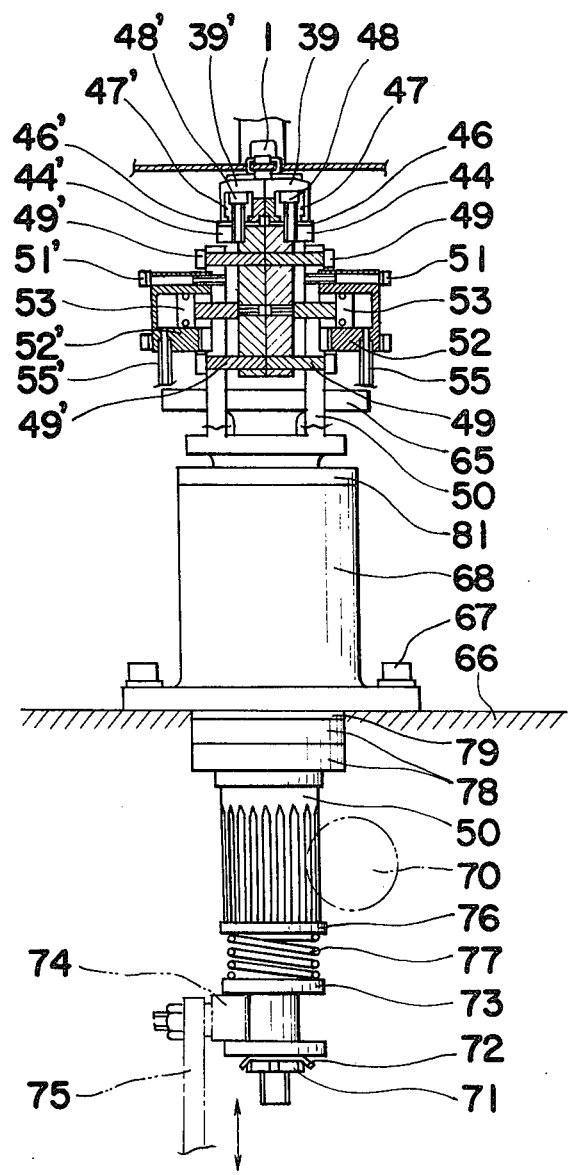

FIG. 17 illustrates the clinching head in a cross sectional representation taken along the line XVII—XVII in FIG. 14.

Before the description of the present invention proceeds, it is to be noted that like parts are designated by like reference numerals throughout the accompanying drawings.

Figure 1:
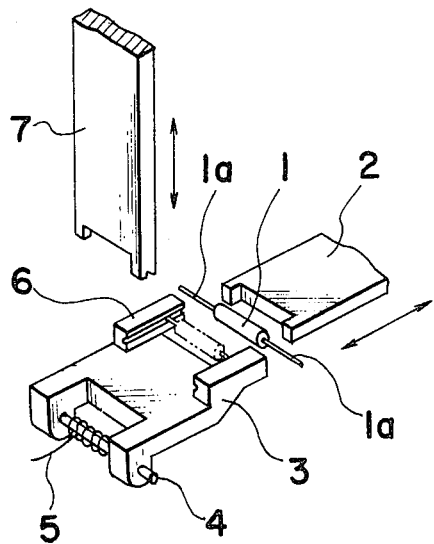
FIG. 1 is a schematic perspective view of an essential portion of a conventional automatic component mounting apparatus shown in one operative position, reference to which has already been made.
Figure 2:
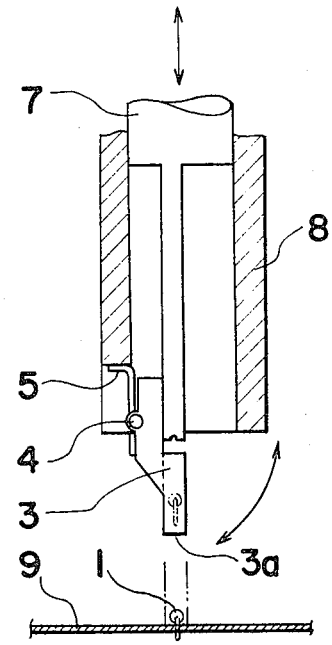
FIG. 2 is a schematic longitudinal sectional view of an essential portion of the conventional automatic component mounting apparatus shown in another operative position, reference to which has already been made.
Figure 3:
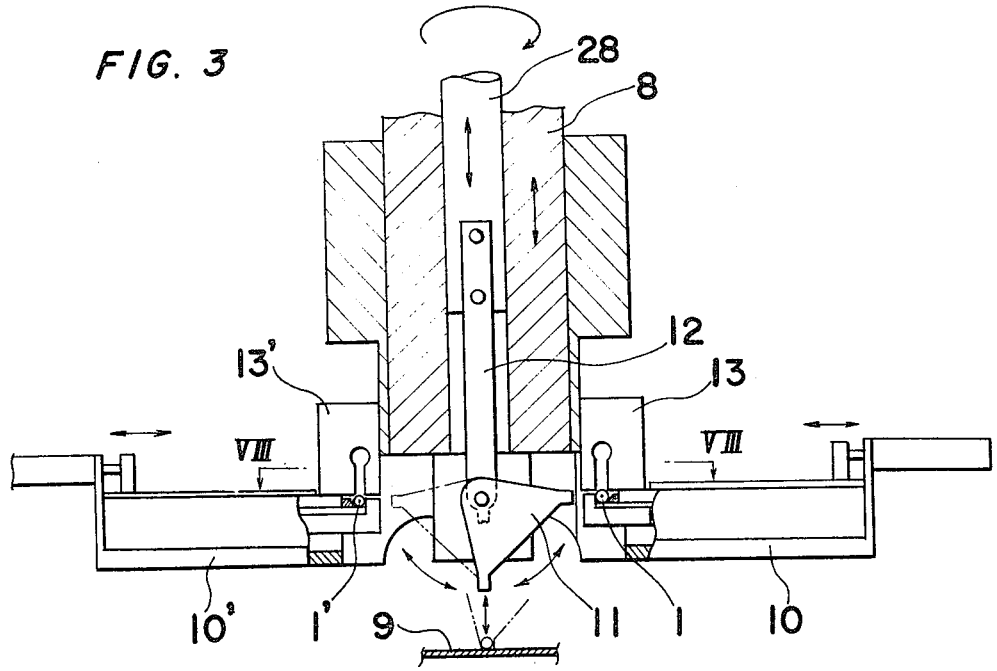
FIG. 3 is a longitudinal side sectional view of an essential portion of an automatic component mounting apparatus according to the present invention.

Referring first to FIGS. 3 to 11 and, particularly, to FIG. 3, an automatic component mounting apparatus illustrated for the purpose of the present invention comprises a pair of opposed component transfer units 10 and 10' having the same construction, a shaping unit including a shaper assembly 11 positioned substantially intermediately between the transfer units 10 and 10' and supported for pivotal movement from an inserting position to either one of first and second positions on respective sides of said inserting position, and an inserting head including a pair of spaced inserting bars 12 and 12' made of metallic or synthetic material having a sufficient elasticity.

Since the transfer units 10 and 10' have the same construction, reference will now be made only to the transfer unit 10 for the sake of brevity, it being to be understood that parts of the transfer unit 10', which are like the parts of the transfer unit 10, are designated by like reference numerals to which a prime is given.

Figure 4:
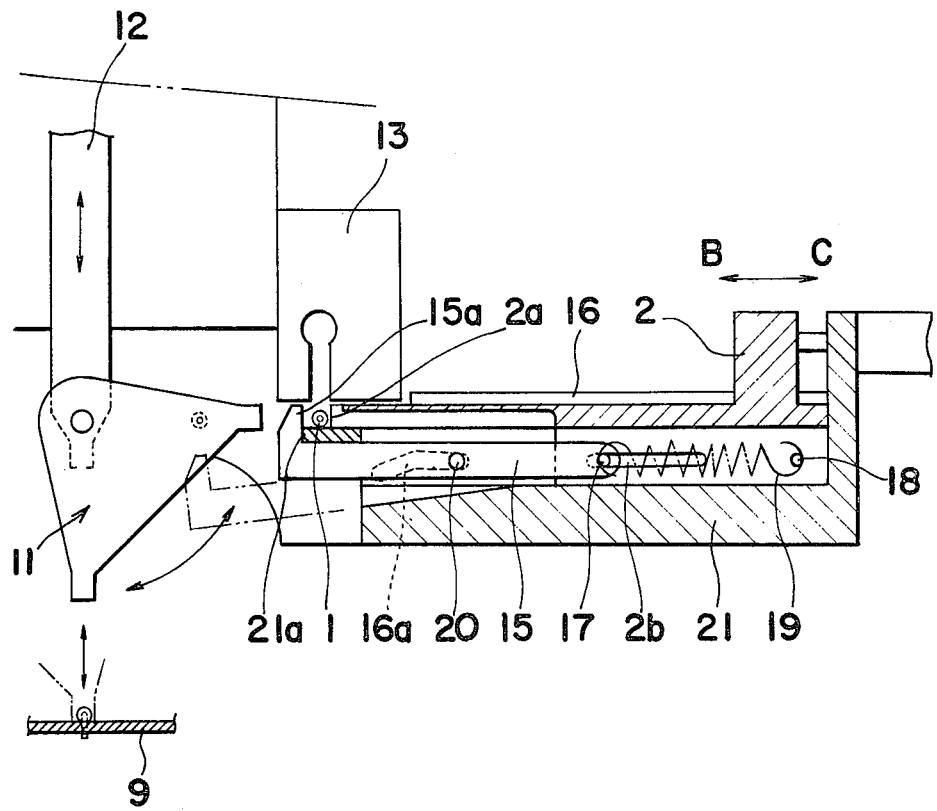
FIG. 4 is a side sectional view, on an enlarged scale, of component transfer and shaping units employed in the apparatus shown in FIG. 3.
Figure 6:
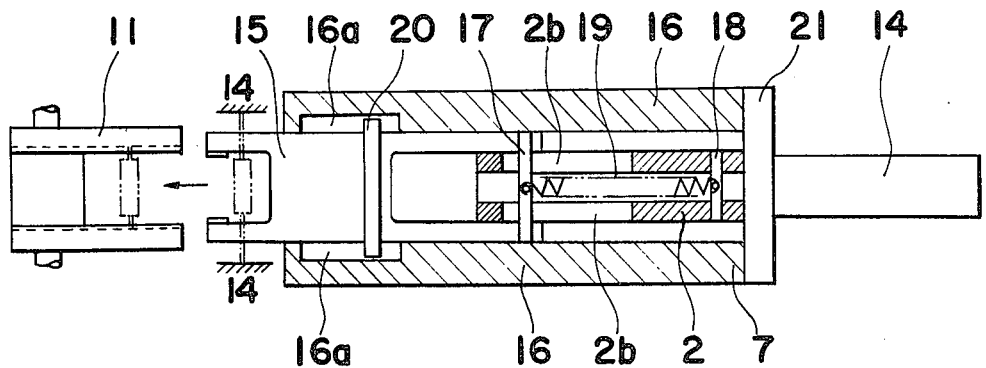
FIG. 6 is a top sectional view of the component transfer unit shown in FIG. 4.

As best shown in FIG. 4, which illustrates the details of the transfer unit 10, the component which has been fed to a predetermined position from a source thereof (not shown) through a chute 13 is transferred onto the shaping unit by the transfer slide 2, which is coupled to a drive mechanism composed, for example, of a fluid-operated cylinder 14, while the terminal wires 1a extending outwardly from the body of component in the opposite directions from each other are sandwiched between a pair of fingers 2a, protruding outwardly from one end of the transfer slide 2 and associated upright fingers 15a formed in spaced relation on one end of an escapement lever 15a in the transfer unit 10. More specifically, the transfer slide 2, mounted on a carrier block 21 for sliding movement between projected and retracted positions and guided by a pair of oppositely spaced guides 16, and the escapement lever 15 operatively positioned substantially intermediately between the slide 2 and the base of the carrier block 21 are operatively so associated that, as the slide 2 is moved a predetermined distance from the retracted position towards the projected position by the operation of the fluid-operated cylinder 14, the terminal wires 1a of the component 1 to be mounted on the printed circuit board 9 are sandwiched between the fingers 2a at one end of the slide 2 and the upright fingers 15a at one end of the escapement lever 15 and, as the slide 2 is moved further towards the projected position after the component 1 has been retained in position with the terminal wires 1a sandwiched in the manner described above, the component so retained is transferred onto the shaper assembly 11 accompanying a corresponding movement of the escapement lever 15 in a direction towards said shaper assembly 11. At the time the slide 2 so moved is moved to the projected position, the escapement lever 15 is forced to pivot in one direction with the upright fingers 15a situated clear of the undersurface of the slide 2. For this purpose, as best shown in FIGS. 4 and 6, the escapement lever 15 is supported in position between the transfer slide 2 and the carrier block 21 for pivotal movement about a pin 17 secured to said lever 15 and loosely journalled in a pair of guide grooves 2b in the slide 2. In addition, a tension spring 19 is connected between the pin 17 and a pin 18 secured to the transfer slide 2 so that the escapement lever is biased in one direction as indicated by the arrow C and is, so long as the transfer slide 2 is held in the retracted position, engaged with a stop 21a with the upright fingers 15a spaced a predetermined distance from the fingers 2a of the slide 2. The escapement lever 15 also has a pin 20 secured thereto and having its opposite ends loosely engaged in a pair of curved guide grooves 16a in the guides 16 for guiding the movement of the escapement lever 15 in a manner as will be described later.

The transfer unit 10 having the construction described above is so designed that, when the transfer slide 2 is moved a certain distance from the retracted position towards the projected position after any one of the components has been fed through the chute 13 to the predetermined position above the escapement lever 15 and between the fingers 2a of the transfer slide 2 and the upright fingers 15a of the escapement lever 15 in the manner as shown by the solid lines in FIGS. 3 to 6, the component so fed is retained in position with the terminal wires 1a sandwiched between said fingers 2a and said upright fingers 15a. A further movement of the transfer slide 2 towards the projected position results in a corresponding movement of the escapement lever 15 in a direction towards the shaper assembly 11 and in a direction as shown by the arrow B in FIG. 4 while the component so retained is transferred towards the shaper assembly 11. During the continued movement of the transfer slide 2 towards the projected position, and after the component so transferred has been received by the shaper assembly 11 in a manner as will be described later, the escapement lever 15 starts pivoting about the pin 20 following the curved contour of the guide grooves 16a in the guides 16 as shown by the broken lines in FIG. 4, the consequence of which is that the upright fingers 15a of the escapement lever 15, which have cooperated with the fingers 2a of the transfer slide 2 to retain the component 1 in position, are lowered clear of the plane of movement of the transfer slide 2.

As will be described later, the component 1 is completely received by the shaper assembly 11 with the outer end portions of the terminal wires 1a bent at right angles to the respective remaining portions of said terminal wires 1a adjacent the body of the component 1 in a direction facing outwardly of the shaper assembly 11, when the transfer slide 2 is completely moved to the projected position. Thereafter, the transfer slide 2 is forced to return towards the retracted position leaving the component 1 retained in position by the shaper assembly 11 as will be described later. During this return movement of the transfer slide 2, the escapement lever 15 is also returned in a direction away from the shaper assembly 11 by the action of the tension spring 19 connecting said lever 15 and slide 2.

It is to be noted that the construction and operation of the transfer unit 10' are substantially identical with those of the above described transfer unit 10.

Figure 7:
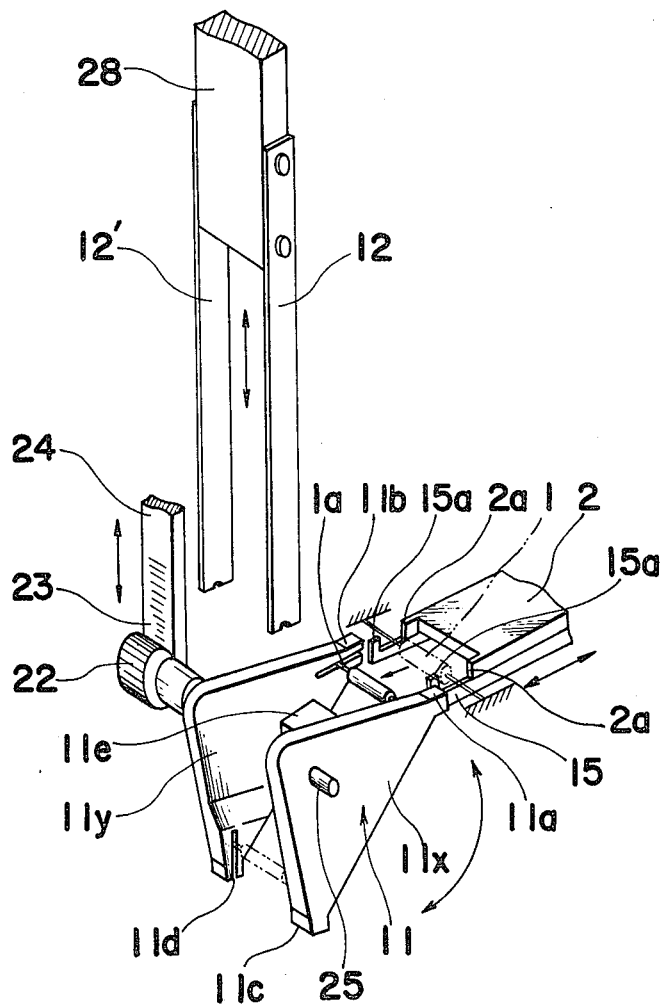
FIG. 7 is a perspective view of the essential portion of the apparatus shown in FIG. 3.

As best shown in FIG. 7, the shaper assembly 11 is constituted by a pair of spaced substantially triangular plates 11x and 11y connected by a bridge member 11e parallel with each other. This shaper assembly 11 has two pairs of grooves defined at 11a, 11b and 11c, 11d, respectively, in the triangular plates 11x and 11y, the function of these pairs of grooves in the triangular plates 11x and 11y being described later.

Figure 8:
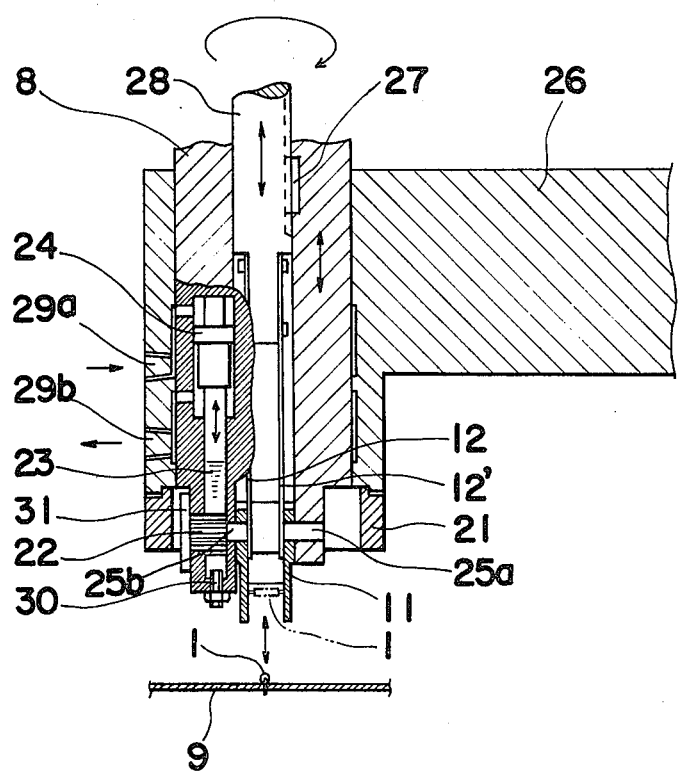
FIG. 8 is a longitudinal side sectional view, with a portion broken away, of an inserting unit employed in the apparatus shown in FIG. 3.

As shown in FIGS. 7 and 8, the shaper assembly 11 is pivotally supported on the lower end of a hollow cylindrical body 8, forming a part of the inserting unit, by means of a shaft 25a, which extends outwardly from the triangular plate 11x and is rotatably supported by the hollow cylindrical body 8, and a shaft 25b, which extends outwardly from the triangular plate 11y in alignment with and in the opposite direction from the shaft 25a and further rotatably extends through the hollow cylindrical body 8, a free end of which shaft 25b has a pinion 22 rigidly mounted thereon and held in constantly meshed relation with a rack 23. The rack 23 is connected to, or otherwise integrally formed with, the lower end of a piston rod 24 operatively accommodated for movement between upwardly and downwardly shifted positions within a working compartment defined in the cylindrical body 8.

The arrangement so far described is so designed that, as long as the piston rod 24 is held in the upwardly shifted position, the shaper assembly 11 assumes the first position, in which condition one pair of the grooves 11a and 11b in the shaper assembly 11 are so aligned with the transfer unit 10 that the component 1 transferred from the transfer unit 10 in the manner as hereinbefore described is received by said shaper assembly 11 with the outer end portions of the respective terminal wires 1a bent and engaged in said grooves 11a and 11b, while when the piston rod 24 is moved to the upwardly shifted position, the shaper assembly 11 assumes the second position in which the other pair of the grooves 11c and 11d in the shaper assembly 11 are so aligned with the transfer unit 10' that the component transferred from the transfer unit 10' in a manner similar to the transfer of the component from the transfer unit 10 into the grooves 11a and 11b is received by said shaper assembly 11 with the outer end portions of the respective terminal wires bent and engaged in the grooves 11c and 11d. It is, however, to be noted that, when the one pair of grooves 11a and 11b in the shaper assembly 11 is aligned with the transfer unit 10 with the shaper assembly 11 in the first position as shown by the solid line in FIG. 3, the grooves 11c and 11d of the other pair in the same shaper assembly 11 are downwardly oriented in readiness for mounting of the component, which would have been transferred onto the assembly 11 from the transfer unit 10', on the printed circuit board, and when the grooves 11c and 11d of the other pair are aligned with the transfer unit 10' with the shaper assembly 11 in the second position as shown by the broken lines in FIG. 3, the grooves 11a and 11b are downwardly oriented in readiness for mounting of the component, which would have been transferred from the transfer unit 10 onto the shaper assembly 11, on the printed circuit board 9.

The cylindrical body 8 carrying the shaper assembly 11 at its lower end as described above is supported by an arm block 26 integral with a machine framework (not shown) for axial sliding and rotary movement between elevated and lowered positions and between X and Y positions spaced at right angles to each other about the longitudinal axis of said cylindrical body 8, respectively. The cylindrical body 8 so supported by the arm block 26 accommodates therein an inserting rod 28 positioned in the hollow of the cylindrical body 8 for sliding movement parallel to the longitudinal axis of the cylindrical body 8 between inoperative and operative positions, said inserting rod 28 being non-rotatable about its own longitudinal axis because of a key-and-groove engagement as shown generally by 27 in FIG. 8. Therefore, it is clear that, while the inserting rod 28 can be axially moved either together with the cylindrical body 8 or independently of the axial movement of the cylindrical body 8, the inserting rod 28 can be rotated only together with the cylindrical body 8 during the rotation of said body 8, said rotation being transmitted to said rod 28 through the key-and-groove engagement 27.

The inserting rod 28 has a lower end to which the elastic inserting bars 12 and 12' are rigidly secured in opposed spaced relation to each other.

The cylindrical body 8 and the inserting rod 28 are operatively so associated that the axial downward movement of the inserting rod 28 from the inoperative position towards the operative position is initiated when and after the cylindrical body 8 has been axially downwardly moved from the elevated position to the lowered position at which time either one of the corner portions of the shaper assembly 11 which are respectively adjacent the pair of the grooves 11a and 11b and the pair of the grooves 11c and 11d is positioned in the vicinity of and above the printed circuit board 9, as shown by the broken lines in FIGS. 3 and 4, in readiness for mounting of the component on the printed circuit board 9. As the inserting rod 28 approaches the operative position with the cylindrical body 8 halted at the lowered position, respective free ends of the inserting bars 12 and 12' engage inner end portions of the respective terminal wires 1a adjacent the body of the component then retained by the shaper assembly 11 with the outer end portions of the terminal wires of the component elastically engaged in the grooves 11a and 11b or 11c and 11d, and, during the continued axial downward movement of the inserting rod 28 towards the operative position, said component can finally be mounted on the printed circuit board 9 with the outer end portions of the terminal wires inserted into holes 9a in the printed circuit board 9.

It is to be noted that the movement of the piston rod 24 between the upwardly shifted position and the downwardly shifted position can be effected by selectively introducing a pneumatic medium, for example, compressed air into the working compartment through inlet ports 29a and 29b. More specifically, when the pneumatic medium is introduced through the inlet port 29a, the piston rod 24 can be axially moved from the upwardly shifted position towards the downwardly shifted position, thereby rotating the shaper assembly from the first position to the second position, while introduction of the pneumatic medium through the inlet port 29b results in the axial movement of the piston rod 24 from the downwardly shifted position towards the upwardly shifted position accompanying rotation of the shaper assembly 11 from the second position back to the first position. The stroke of movement of the piston rod 24 between the upwardly and downwardly shifted positions can be adjusted by manipulating a stop 30 which is, for example, in the form of an adjustment screw with which the lower end of the rack 23 integral with the piston rod 24 abuts when the piston rod 24 is completely moved to the downwardly shifted position.

Reference numeral 31 employed in FIG. 8 represents a shielding disc which serves to prevent any possible axial displacement or separation of the pinion 22 from the shaft 25b and also to shield the pinion 22 from view.

Figure 5:
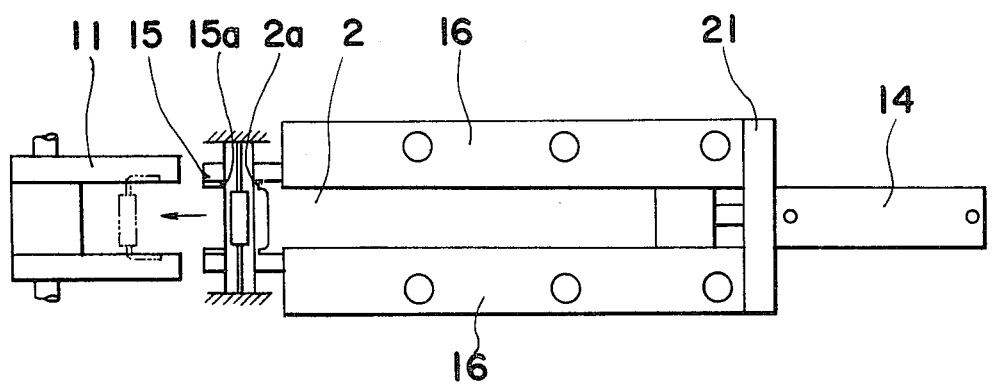
FIG. 5 is a top plan view of the component transfer unit shown in FIG. 4.
Figure 10:
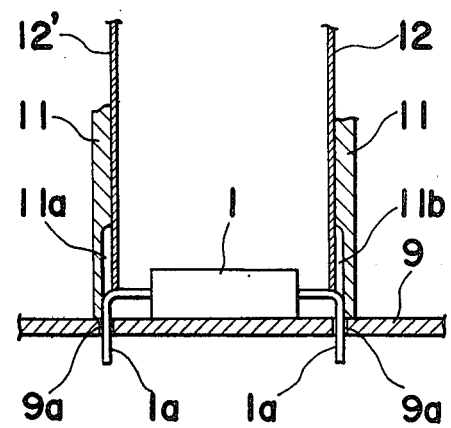
FIGS. 10 and 11 illustrate a method of mounting on a printed circuit board components having different spans between the bent ends of the terminal wires.
Figure 11:
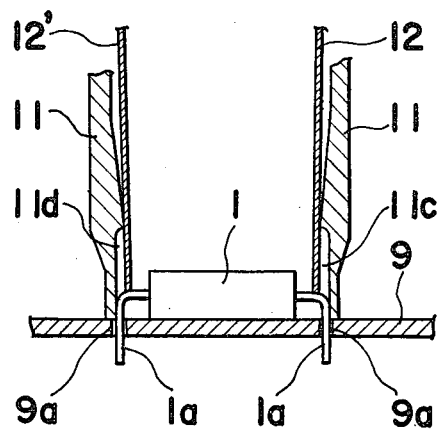

In assembling the shaper assembly 11, the latter should be so designed that the body of the component, which is transferred from either one of the transfer units 10 and 10' with its terminal wires 1a extending straight outwardly from said body, will enter the space between the triangular plates 11x and 11y with the outer end portions of said terminal wires bent rearwardly of the direction of insertion of said component towards the shaper assembly 11 on one hand and, on the other hand, slidingly engaged in the adjacent grooves 11a and 11b or 11c and 11d in the triangular plates 11x and 11y as best shown by the broken lines in FIGS. 5 and 6. The component so received by the shaper assembly 11 does not separate from said shaper assembly 11 even though the grooves 11a and 11b or 11c and 11d are downwardly oriented upon pivotal movement of the shaper assembly 11 to the second or first position, because the outer end portions of the terminal wires 1a of the component 1, which have been bent as described above, tend to return to the initial position due to their own elasticity and, therefore, the bent outer end portions of the terminal wires of the component are firmly engaged in the grooves 11a and 11b or 11c and 11d with the body of the component being retained in position between the plates 11x and 11y.

Where the span between the fingers 2'a of the transfer slide 2' and, therefore, between the upright fingers 15'a of the escapement lever 15' of the transfer unit 10' is smaller than that between the fingers 2a and, therefore, between the upright fingers 15a of the transfer unit 10 for enabling the machine to mount the components of different size one at a time on the printed circuit board 9, what is necessary is to make the span between the grooves 11c and 11d at one corner portion of the shaper assembly 11 smaller than that between the grooves 11a and 11b at the other corner portion of the shaper assembly 11 as can readily be understood from a comparison between FIG. 10 and FIG. 11. It is to be noted that, even though the span between the grooves 11c and 11d is made smaller than that between the grooves 11a and 11b, the inserting bars 12 and 12' spaced a fixed distance from each other can function satisfactorily because the inserting bars 12 and 12', which are spaced a distance corresponding to the span between the grooves 11a and 11b, can be forced to inwardly deform resiliently in a direction towards each other as the inserting bars 12 and 12' are moved downwardly together with the descending motion of the inserting rod 28 while being guided along the opposed surfaces of the respective triangular plates 11x and 11y, the consequence of which is that the span between the free ends of the inserting bars 12 and 12' becomes complementary to the span between the grooves 11c and 11d.

Figure 9:
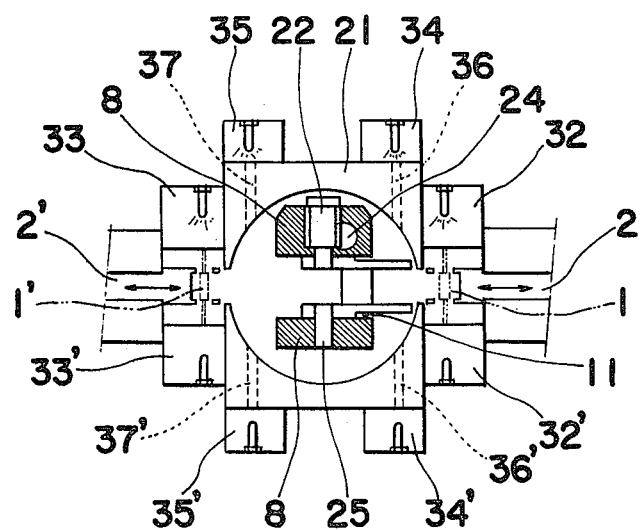
FIG. 9 is a cross-sectional view taken along the line VIII—VIII in FIG. 3.

With particular reference to FIG. 9, which is a cross sectional representation of the inserting unit taken along the line VIII—VIII in FIG. 3, reference numerals 32 and 32' respectively represent a light source and a photocell which form parts of a first detector for detecting the presence or absence of the component fed through the chute 13 to the predetermined position above the escapement lever 15 and between the fingers 2a and the upright fingers 15a. Reference numerals 33 and 33' respectively represent a light source and a photocell which form parts of a second detector for detecting the presence or absence of the component fed through the chute 13' to the predetermined position above the escapement lever 15' and between the fingers 2'a and the upright fingers 15'a.

Reference numerals 34 and 34' respectively represent a light source and a photocell for sensing the passage of light from the light source 34 through axially aligned light passages 36 and 36' defined in the carrier block 21, said light source 34 and said photocell 34' forming parts of a third detector for detecting the exact positioning of the shaper assembly 11 at the first position. On the other hand, reference numerals 35 and 35' respectively represent a light source and a photocell for sensing the passage of light from the light source 35 through axially aligned light passages 37 and 37' defined in the carrier block 21, said light source 35 and said photocell 35' forming parts of a fourth detector for detecting the exact positioning of the shaper assembly 11 at the second position.

The third and fourth detectors may be electrically connected to a control (not shown) for controlling a distributor (not shown) for distributing the components, which are successively supplied thereto from a supply unit, which may be of a type disclosed in U.S. Pat. No. 3,597,827, patented on Aug. 10, 1971 and assigned to the same assignee as the present invention, into either one of the chutes 13 and 13' depending upon whether said control receives an electric signal from the third detector or whether said control receives an electric signal from the fourth.

The clinching unit for cutting undesired portions off the ends of the terminal wires of the component which project outwards from the printed circuit board after the component has been mounted on the circuit board, and simultaneously therewith, for bending the cut ends of the terminal wires in a direction towards each other to secure the component to the printed circuit board will now be described in more detail with particular reference to FIGS. 12 to 17.

Referring now to FIGS. 12 to 17, the clinching unit is operatively positioned immediately below and in alignment with the inserting unit having the construction as hereinbefore fully described with the circuit board 9 situated between said inserting unit and said clinching unit. FIG. 12(a) illustrates the condition prior to the component being mounted on the printed circuit board 9, wherein a pair of movable cutters 38 and 38' cooperating with a pair of adjustable fixed cutters 39 and 39', all being positioned immediately below the printed circuit board 9, are held in their inoperative positions. With the movable cutters 38 and 38' held in the inoperative positions, cutter blades 38a and 38'a of these movable cutters 38 and 38' are spaced a predetermined distance $h$ from associated cutter blades 39a and 39'a of the fixed cutters 39 and 39'.

FIG. 12(b) illustrates the condition subsequent to the mounting of the component 1 on the printed circuit board 9, wherein the bent outer end portions of the terminal wires 1a of the mounted component 1 extend outwards from and below the printed circuit board 9 into respective spaces between the cutter blades 38a and 39a and between the cutter blades 38'a and 39'a. FIG. 12(c) illustrates the condition established immediately after the components 1 have been secured to the printed circuit board 9. After the component 1 has been mounted on the printed circuit board 9 with the bent outer end portions of the respective terminal wires 1a inserted through the holes 9a in the board 9, the movable cutters 38 and 38' are shifted upwardly together with the fixed cutters 39 and 39', approaching the undersurface of the circuit board 9. Thereafter, while the upward movement of the movable cutters 38 and 38' together with the fixed cutters 39 and 39' is stopped, the movable cutters 38 and 38' are pivoted towards their operative positions with the cutter blades 38a and 38'a approaching the associated cutter blades 39a and 39'a while moving along a curved path at the ends of the angular movement of the cutters. The cutter blades 38a and 38'a, when the movable cutters 38 and 38' are thus pivoted, cooperate with the cutter blades 39a and 39'a of the fixed cutters 39 and 39' to cut to a predetermined length the excessive portions of the terminal wires 1a of the mounted component 1. Simultaneously with the cutting of the excessive portions of the component terminal wires 1a, upper end portions 38b and 38'b of the movable cutters 38 and 38', as the latter pivot towards the operative positions, bend the cut ends of the terminal wires of the mounted component 1 in a direction towards each other along the undersurface of the printed circuit board 9, thereby securing the mounted component 1 to the printed circuit board 9.

As best shown in FIGS. 12 to 17, the movable cutters 38 and 38' are secured respectively to holders 43 and 43' through electrically insulating layers 40 and 40' and 41 and 41' by means of separate sets of a plurality of bolts 42 and 42' which holders 43 and 43' are in turn supported in position for pivotal movement about respective pins 45 and 45' which are secured to retaining blocks 44 and 44'. On the other hand, the fixed cutters 39 and 39', the spacing between the cutter blades 39a and 39'a being adjustable as will be described later, are positioned between the movable cutters 38 and 38' and are secured to the retaining blocks 44 and 44', respectively, through electrically insulating layers 46 and 46' and 47 and 47' by means of bolts 48 and 48'. The retaining blocks 44 and 44' are supported in position for movement towards and away from each other by means of two guide rods 49 and 49', respectively, the movement of said retaining blocks 44 and 44' in one direction being effected by respective piston rods 53 and 53' having one end secured to said retaining blocks and the other ends slidingly movably accommodated in fluid-operated cylinders 52 and 52' which are rigidly mounted on a cylindrical rotary body 50 by means of a plurality of bolts 51. The guide rods 49 are carried by the rotary body 50. On the other hand, the movement of the retaining blocks 44 and 44' in the opposite direction is effected by spring members 54 and 54' respectively disposed between the retaining block 44 and the rotary body 50 and between the retaining block 44' and the rotary body 50.

It is to be noted that the movement of the piston rods 53 and 53' is preferably effected by the application of a pneumatic medium, for example, compressed air which is supplied through respective air inlets 55 and 55'. The stroke of movement of the retaining blocks 44 and 44' which determines the spacing between the fixed cutters 39 and 39' as can readily be understood from a comparison of FIG. 12 with FIG. 13, is determined by respective pin members 57 and 57' fitted on the rotary body 50 by means of set washers 56, said pin members 57 and 57' having respective abutments 58a and 58'a against which said retaining blocks 44 and 44' abut.

The holders 43 and 43' carry rollers 60 and 60' rotatably mounted on one end thereof by means of pin members 59 and 59' and, on the other hand, the retaining blocks 44 and 44' carry transmission rods 62 and 62' mounted thereon by means of respective slidable sleeves 61 and 61', said transmission rods 62 and 62' being engaged at one end with the associated rollers 60 and 60' by the action of tension springs 64 and 64' which are connected between the pin members 59 and 59' and pins 63 and 63' secured to said rotary body 50, respectively. It is to be noted that the transmission rods 62 and 62' can be moved axially simultaneously incident to upward and downward movement of a pushing rod 65 having an upper flanged end held in contact with lower ends of said transmission rods 62 and 62, said pushing rod 65 being axially slidably accommodated within the hollow interior of the cylindrical body 50.

The rotary body 50 is supported in a bearing sleeve 69 in a cylindrical housing 68, mounted on a machine base 66 by means of a plurality of set bolts 67, for rotary and axial sliding movement. This rotary body 50 has on the outer periphery adjacent its lower end gear teeth 50a which are held in constantly meshed relation with a rack (not shown) formed on a portion of a piston 70 (the details of which are herein omitted) which is supported below the machine base 26, so that the rotary body 50 can be rotated about its own longitudinal axis through a predetermined angle in response to movement of the piston 70. The rotary body 50 can also be axially moved between elevated and lowered positions by a drive lever 75. Although the details of the drive lever 75 are herein omitted, the lever 75 is shown to have a roller 74 rotatably mounted on one end which is engaged in a circumferentially grooved holder 73 rigidly mounted on the lower end of the pushing rod 65 through a ring washer 72 by means of a nut member 71 so that movement of the lever 75 will result in the corresponding movement of the rotary body between the elevated and lowered positions.

Between the holder 73 and the rotary body 50, there are provided a bushing 76 and a compression spring 77, said compression spring 77 biasing the rotary body 50 towards the elevated position. The elevated position of the rotary body 50 is defined by the lower end of the cylindrical housing 6 against which two nuts 78, mounted on a threaded portion 50b on a substantially intermediate portion of said rotary body 50, abut through a cushioning member 79 disposed between said lower end of the housing 68 and the nuts 78 and around said rotary body 50. On the other hand, the lowered position of said rotary body 50 is defined by a cushioning member 81 secured to an upper end of the housing 68 by means of bolts 80, against which cushioning member 81 an upper flanged end of said rotary body 50 is engaged upon arrival of said body 50 at said lowered position.

The pivotal movement of the movable cutters 38 and 38' is effected in response to an upward and downward movement of the drive lever 75, in such a manner that, when said lever 75 is upwardly shifted, the rotary body 50 and the pushing rod 65 are also shifted upwardly together, the cushioning member 79 being subsequently engaged with the lower end of the housing 68 at which time the rotary body 50 is completely moved to the elevated position. As the drive lever 75 is shifted further upwardly while the rotary body 50 is halted at the elevated position, the pushing rod 65 is moved further upwardly with the spring 77 being gradually axially compressed, the further upward movement of said pushing rod 65 being transmitted to the rollers 60 and 60' through the associated transmission rods 62 and 62' so that the holders 43 and 43' are pivoted about the respective mounting pins 45 and 45'. The consequence is that the movable cutters 38 and 38' are pivoted in the direction towards each other and towards the fixed cutters 39 and 39', respectively, thereby performing a cutting operation. It is to be noted that the axial downward movement of the pushing rod 65 is restricted by engagement of a set ring 82 with a stop 83 fitted around the rotary body 50.

In order to make it possible to adjust the span S between the fixed cutters 39 and 39' and, correspondingly, that between the movable cutters 38 and 38' depending upon the distance between the holes 9a in the printed circuit board 9, that is, the span between the terminal wires of the component 1 which are inserted through the holes 9a in the printed circuit board 9, the retaining blocks 44 and 44' for the support of the movable cutters 38 and 38' and the fixed cutters 39 and 39' are adjustably moved by piston rods 53 and 53', respectively. It is to be noted that the transmission rods 62 and 62', which are disposed between the pushing rod 65 and the retaining blocks 44 and 44', always contact the retaining blocks 44 and 44' at one end and the pushing rod 65 at the other end, irrespective of whether the piston rods 53 and 53' are in the retracted positions or whether the piston rod 53 and 53' are in the projected positions. Accordingly, since the clinching unit according to the present invention is so designed that, irrespective of the movement of the piston rods 53 and 53', cutting and bending of the terminal wires 1a of the mounted component 1 can be simultaneously performed, two kinds of the components having different spans between the bent outer end portions of the terminal wires can be mounted on the printed circuit board by operating the piston rods 53 and 53' to adjust the span S (FIG. 13) and, correspondingly, the span between the movable cutters 38 and 38'.

Failure or success of the mounting of the individual components on the printed circuit board 9 and/or the exact positioning of the individual components in terms of polarity if said components are constituted by diodes, can be detected by a detector (the details of which detector are herein omitted) through electric connection wires 86 and 86' which extend between said detector and the movable cutters 38 and 38', respectively, the connection between said cutters 38 and 38' and the associated wires 86 and 86' being made through respective bolts 85 surrounded by electrically insulating sleeves 84 and 84'.

From the foregoing full description of the present invention, it has now become clear that, since in the machine embodying the present invention cutting and bending of the terminal wires of the components one at a time are simultaneously performed in reference to the terminal wires, not in reference to the body of the component such as we performed in the conventional machine of a similar kind, the machine, particularly, the transfer and inserting units employed in the machine embodying the present invention can accommodate components of any size and shape without being adversely affected and without substantially imposing an external pulling force on any one of the component terminal wires, thereby minimizing the possibility of damage to the components to be mounted on the printed circuit board.

Moreover, according to the present invention, with the machine embodying the present invention, two kinds of components of different size and, therefore, having a different span between the bent outer ends of the terminal wires can advantageously be mounted on the printed circuit board selectively.

The movement of the inserting rod having the spaced inserting bars is effected by an inserting lever (the details of which are not described and shown) which is operatively so associated with the drive lever for axially moving the rotary body that inserting of the component terminal wires through the holes in the printed circuit board is synchronized with the cutting and bending operation. Therefore, it is also clear that continuous and automatic mounting of the components on the printed circuit board can advantageously be achieved at a higher speed than that of the conventional machine of the similar kind.

Furthermore, the angular movement of the movable cutters in a direction towards the associated fixed cutters is advantageous in that the unnecessary portions of the component terminal wires which project outwardly from the printed circuit board can be positively pulled outward, shortly before the cutting and bending operation, so that the component can ultimately firmly be mounted on the printed circuit board with the cut ends of the component terminal wires bent inwardly towards each other along the undersurface of the printed circuit board.

While the present invention has fully been described, it is to be noted that various changes and modifications will be apparent to those skilled in the art without departing from the true scope of the present invention, such changes and modifications being understood as included within the true scope of the present invention unless they depart therefrom.

What is claimed is:

1. In an automatic component mounting apparatus for automatically mounting on a plate-like workpiece having a plurality of pairs of holes electrical components one at a time, each of said components being of a type constituted by a component body having a pair of terminal wires extending axially outwardly from the component body in opposite directions with respect to each other, which apparatus comprises a supply unit from which the components are issued successively one at a time, and a mounting unit for bending the terminal wires of each component which has been delivered from said supply unit, and also for mounting the component on the workpiece with the bent terminal wires inserted through a pair of holes in the workpiece, the improvement wherein said mounting unit comprises:

a substantially elongated inserting head supported for axial sliding and rotary motion between elevated and lowered positions in a direction parallel to the longitudinal axis thereof and first and second positions angularly spaced about said longitudinal axis thereof, respectively, said inserting head including a pair of spaced inserting bars made of elastic material;

a pair of opposed, first and second transfer units positioned on respective sides of said inserting head and connected to the supply unit for receiving the components in each of said transfer units; and a shaper assembly pivotally carried by said inserting head for selective movement between first and second positions and having spaced, first and second component supports, said first component support being, when said shaper assembly is in said first position, aligned with said first transfer unit for receiving the component from said first transfer unit while said second component support is substantially downwardly oriented towards the workpiece, said second component support being, when said shaper assembly is in said second position, aligned with said second transfer unit for receiving the component from said second transfer unit while said first component support is substantially downwardly oriented towards the workpiece, each of said transfer units having means for transferring the components to said shaper assembly, each of said component supports in said shaper assembly having means shaped so that, as the component is transferred from the adjacent transfer unit onto the shaper assembly, said component support receives said component so transferred while causing the outer end portions of said terminal wires of said component transferred to be bent in the direction of said adjacent transfer unit;

said inserting head when moved to the lowered position causing the inserting bars to push said component carried by either one of said first and second component supports then downwardly oriented towards the workpiece for moving the bent outer end portions of the component terminal wires facing the workpiece through the pair of holes in the workpiece.

2. An automatic component mounting apparatus as claimed in claim 1, wherein said shaper assembly is constituted by a pair of substantially triangular plates connected to each other in spaced relation and wherein each of said first and second component supports is constituted by a pair of opposed grooves respectively formed in apex portions of said plates and facing each other.

3. An automatic component mounting apparatus as claimed in claim 2, wherein the span between the grooves of one pair, which form one of said first and second component supports, is smaller than that between the grooves of another pair, which form the other of said first and second component supports.

4. An automatic component mounting apparatus as claimed in claim 3, wherein said transferring means in each of said first and second transfer units comprises a substantially elongated slide supported for movement between projected and retracted positions and having a pair of spaced fingers formed at one end thereof adjacent the shaper assembly and an escapement lever having a pair of spaced upright fingers formed at one end thereof adjacent said fingers in said slide, said escapement lever when said slide is in said retracted position being positioned with said upright fingers spaced a predetermined distance from said fingers on said slide for allowing the component so supplied to be positioned in a space between said fingers in said slide and said upright fingers in said escapement lever, said component being transported towards the shaper assembly with the terminal wires sandwiched between said fingers in said slide and said upright fingers in said escapement lever during the movement of said slide towards said projected position.

5. In an automatic component mounting apparatus for automatically mounting on a plate-like workpiece having a plurality of pairs of holes electrical components one at a time, each of said components being of a type constituted by a component body having a pair of terminal wires extending axially outwardly from the component body in opposite directions with respect to each other, which apparatus comprises a supply unit from which the components are issued successively one at a time, and a mounting unit for bending the terminal wires of each component which has been delivered from said supply unit, and also for mounting the component on the workpiece with the bent terminal wires inserted through a pair of holes in the workpiece, the improvement wherein said mounting unit comprises:

a substantially elongated inserting head supported for axial sliding and rotary motion between elevated and lowered positions in a direction parallel to the longitudinal axis thereof and first and second positions angularly spaced about said longitudinal axis thereof, respectively, said inserting head including a pair of spaced inserting bars made of elastic material;

a pair of opposed, first and second transfer units positioned on respective sides of said inserting head and connected to the supply unit for receiving the components in each of said transfer units; and a shaper assembly pivotally carried by said inserting head for selective movement between first and second positions and having spaced, first and second component supports, said first component support being, when said shaper assembly is in said first position, aligned with said first transfer unit for receiving the component from said first transfer unit while said second component support is substantially downwardly oriented towards the workpiece, said second component support being, when said shaper assembly is in said second position, aligned with said second transfer unit for receiving the component from said second transfer unit while said first component support is substantially downwardly oriented towards the workpiece, each of said transfer units having means for transferring the components to said shaper assembly, each of said component supports in said shaper assembly having means shaped so that, as the component is transferred from the adjacent transfer unit onto the shaper assembly, said component support receives said component so transferred while causing the outer end portions of said terminal wires of said component transferred to be bent in the direction of said adjacent transfer unit;

said inserting head when moved to the lowered position causing the inserting bars to push said component carried by either one of said first and second component supports then downwardly oriented towards the workpiece for moving the bent outer end portions of the component terminal wires facing the workpiece through the pair of holes in the workpiece, and further comprising a clinching unit for cutting unnecessary portions of the bent terminal wires which project outwards from the workpiece and simultaneously for bending the cut ends of the terminal wires inwardly in a direction towards each other to secure the component to the workpiece.

6. An automatic component mounting apparatus as claimed in claim 5, wherein said clinching unit comprises a pair of movable cutters having respective movable cutter blades extending in parallel and spaced relation to each other and a pair of adjustable fixed cutters having respective fixed cutter blades extending in parallel and spaced relation to each other and also to the corresponding one of said movable cutter blades, said fixed cutters being positioned between said movable cutter blades, said movable cutters cooperating with said fixed cutters to perform cutting of the unnecessary terminal wire portions with the movable cutter blades approaching the associated fixed cutter blades, cut ends of said terminal wires being, simultaneously with said cutting, bent inwardly in a direction towards each other thereby securing the mounted component on the workpiece, the spacing between said fixed cutters being adjustable and said clinching unit being supported below the workpiece for sliding movement in a direction perpendicular to said workpiece and also for rotation about an axis perpendicular to said workpiece.

7. An automatic component mounting apparatus as claimed in claim 6, wherein said movable cutters, including said movable cutter blades, are supported in an electrically insulated relation to each other.

8. An automatic component mounting apparatus as claimed in claim 5, further comprising a first drive means connected to said clinching unit for rotating said clinching unit, a second drive means connected to said movable cutters for driving said movable cutters to cause said movable cutter blades to be moved in a direction towards each other and towards the associated fixed cutter blades, a first tool drive means connected to said movable cutters and said fixed cutters for selectively moving said movable cutters and said fixed cutters between an upwardly shifted position with said cutters approaching the undersurface of said workpiece and a downwardly shifted position with said cutters spaced away from said undersurface of said workpiece, and a second tool drive means connected to said fixed cutters for moving said fixed cutters for adjustment of the space between said fixed cutters.

9. An automatic component mounting apparatus as claimed in claim 8, wherein said first and second tool drive means comprise respective hollow cylindrical members having a different radius of curvature, said cylindrical members being axially movably and coaxially supported one within the other and an elastic member connecting said cylindrical members for causing axial movement of either one of said cylindrical members to be transmitted to the other of said cylindrical members through said elastic member, and means for restricting the stroke of movement of any one of said cylindrical members which is moved by the other of said cylindrical members through said elastic member.

10. An automatic component mounting apparatus as claimed in claim 8, wherein one of said cylindrical members which is axially slidably accommodated within the other of said cylindrical members in a coaxial relation thereto has therein a passage for exhaust of fragments which have been cut from the component terminal wires.

* * * * *